(12) United States Patent
Popescu

(10) Patent No.: US 12,710,491 B2
(45) Date of Patent: Aug. 18, 2026

(54) METHOD AND MEASURING APPARATUS FOR MEASURING A MAGNETIC FIELD IN A FIELD OF VIEW OF A MAGNETIC RESONANCE FACILITY

(71) Applicant: Siemens Healthineers AG, Forchheim (DE)

(72) Inventor: Stefan Popescu, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 168 days.

(21) Appl. No.: 18/416,719

(22) Filed: Jan. 18, 2024

(65) Prior Publication Data

US 2025/0020743 A1 Jan. 16, 2025

(30) Foreign Application Priority Data

Jan. 25, 2023 (EP) .................................... 23153270

(51) Int. Cl.
*G01R 33/24* (2006.01)
*G01R 33/00* (2006.01)

(52) U.S. Cl.
CPC ......... *G01R 33/24* (2013.01); *G01R 33/0094* (2013.01)

(58) Field of Classification Search
CPC ... G01R 33/24; G01R 33/0094; G01R 33/243
USPC .......................................................... 324/260
See application file for complete search history.

(56) References Cited

U.S. PATENT DOCUMENTS 5,313,164 A 5/1994 Starewicz
5,635,839 A 6/1997 Srivastava
6,288,624 B1 * 9/2001 Savelainen ............... H01F 7/20 335/216
8,810,243 B2 * 8/2014 Blumhagen .......... G01R 33/445 324/309
10,018,690 B2 7/2018 Overweg et al.
10,520,566 B2 * 12/2019 Poole ..................... A61B 5/055
10,768,257 B2 9/2020 Popescu
(Continued)

FOREIGN PATENT DOCUMENTS

WO 2014097056 A1 6/2014

OTHER PUBLICATIONS

"How to divide a sphere into many equally sized triangular tiles?", in: https://math.stackexchange.com/questions/4353736/how-to-divide-a-sphere-into-many-equally-sized-triangular-tiles [retrieved on Jan. 17, 2024]. (3 pages).

(Continued)

*Primary Examiner* — Christopher P McAndrew
(74) *Attorney, Agent, or Firm* — Lempia Summerfield Katz LLC

(57) ABSTRACT

A method for measuring a magnetic field in a field of view of a magnetic resonance facility includes: providing a measuring apparatus including at least one magnetic field sensor; measuring sensor data describing the magnetic field at a plurality of measuring points on a measuring surface enclosing at least part of the field of view; and ascertaining magnetic field information, which models the magnetic field three-dimensionally, at least within the field of view, from the sensor data, wherein the measuring points are selected in a uniformly distributed sampling pattern for uniform sampling of the entire measuring surface.

18 Claims, 5 Drawing Sheets

(56) References Cited

U.S. PATENT DOCUMENTS

| | | | | |
|---|---|---|---|---|
| 2007/0145977 | A1* | 6/2007 | Keupp | G01R 33/563 324/318 |
| 2011/0095762 | A1* | 4/2011 | Piccini | G01R 33/4826 324/312 |
| 2015/0338475 | A1 | 11/2015 | Overweg et al. | |
| 2020/0088817 | A1* | 3/2020 | Poole | G01R 33/3802 |
| 2022/0252685 | A1 | 8/2022 | Popescu | |
| 2022/0404446 | A1 | 12/2022 | Popescu | |
| 2023/0333190 | A1 | 10/2023 | Popescu | |

OTHER PUBLICATIONS

Aitken A Pet al: “Improved UTE-based attenuation correction for crania1 PET-MR using dynamic magnetic fie1d monitoring”; Medical Physics; AIP, Melville, NY, US; Bd. 41, Nr. 1; 17. Dec. 2013, (13 pages).

Anonymous: “MFC-3045 Magnetic Field Camera User’s Manual”; Online; 2004; XP093053729; Internet; https://www.metrolab.com/wp-content/up loads/2015/07/MFC3045_manual_v30_rev10.pdf. (82 pages).

Lei, K. et al. “A New Coordinate System for Constructing Spherical Grid Systems” Appl. Sci. 2020, 10, 655. https://doi.org/10.3390/app10020655. (26 pages).

Rezaee Javan, A. et al. “Dividing a sphere into equal-area and/or equilateral spherical polygons.” Journal of Computational Design and Engineering 9.2 (2022): 826-836. (11 pages).

Youtube Video re: “Metrolab Technology SA Magnetic Field Camera MFC2046”, in: https://www.youtube.com/watch?v=a_OkDgJHRKs [retrieved on Jan. 17, 2024]. (3 pages).

Youtube re: “Shared images of Magnetic Field Cameras and NMR Precision Teslameters at work” in: https://www.youtube.com/watch?v=I7cAmv9dTCw [retrieved onJan. 17, 2024]. (2 pages).

Dietrich, Benjamin E., et al. “A field camera for MR sequence monitoring and system analysis.” Magnetic resonance in medicine 75.4 (2016): 1831-1840.

* cited by examiner y
z
3
15
14
16
30
31
13
22
23
18
29
24
21
9
25
12'
11
28
27

METHOD AND MEASURING APPARATUS FOR MEASURING A MAGNETIC FIELD IN A FIELD OF VIEW OF A MAGNETIC RESONANCE FACILITY

The present patent document claims the benefit of European Patent Application No. 23153270.6, filed Jan. 25, 2023, which is hereby incorporated by reference in its entirety.

TECHNICAL FIELD

The disclosure relates to a measuring apparatus and a method for measuring a magnetic field in a field of view of a magnetic resonance facility. The method includes: providing a measuring apparatus including at least one magnetic field sensor; measuring sensor data describing the magnetic field at a plurality of measuring points on a measuring surface enclosing at least part of the field of view; and ascertaining magnetic field information, which models the magnetic field three-dimensionally, at least within the field of view, from the sensor data.

BACKGROUND

Magnetic resonance imaging is now an established tool in medical diagnostics. It is based on exciting nuclear spins within a patient, which are aligned in a direction by a main magnetic field (static magnetic field or B0 field) of a magnetic resonance facility, with radio-frequency pulses and measuring the decay of the excitation, for which a suitable radio-frequency coil arrangement may be used. Gradient fields of a gradient coil arrangement are used for spatial encoding.

As the complexity of clinical issues investigated by magnetic resonance increases, so does the desire for high or increasing image quality of recorded magnetic resonance data. A prerequisite for high-quality measurements in magnetic resonance imaging in order, for example, to reconstruct anatomical images that are as artifact-free as possible, is that the magnetic fields used to measure the magnetic resonance data meet high requirements with regard to quality. For example, the main magnetic field is sufficiently strong and at the same time extremely homogeneous in the measurement volume, which may be referred to as the field of view (FoV). In order to obtain magnetic resonance data that is as geometrically and anatomically accurate as possible, the gradient fields, (which are used in particular to encode the spatial coordinates), are monotonic and (e.g., seamlessly linear) across the field of view. Examples of requirements for the homogeneity of the main magnetic field are deviations of less than 20 ppm peak-to-peak or less than 3 ppm root mean square (RMS). When using conventional methods, in particular conventional magnetic resonance sequences and recording protocols, sufficiently accurate magnetic resonance data may only be recorded in fields of view that meet such requirements.

However, due to the physical and technical conditions, such requirements result in high costs for the equipment needed for magnetic resonance imaging, in particular with respect to the materials, production, and operating costs of high-field magnets. In order to reduce the costs associated with the high magnetic field homogeneity and linearity of the gradient fields, the field of view is restricted in all three spatial dimensions. However, such a restriction of the field of view has clinical disadvantages, such as truncated magnetic resonance images in the case of obese patients or longer scan times to cover larger regions of the body, for example, for whole-body cancer scans. In this case, improvements may be achieved by tolerating non-ideal magnetic field distributions. For example, it has already been proposed in the prior art that such non-ideal magnetic fields be calibrated and modeled a priori in order to reduce and/or correct image artifacts on the basis of magnetic field information by using non-standardized image reconstruction methods.

This way of measuring magnetic fields in magnetic resonance facilities is also useful and known, for example, if shim measures are to be set and/or electronic corrective measures are to be prepared, even in a smaller field of view.

In other words, measuring the magnetic field in a magnetic resonance facility as accurately as possible is an important task for magnetic resonance imaging in many areas of application.

The prior art has proposed a variety of different measuring apparatuses for measuring magnetic fields in a magnetic resonance facility. These may be referred to as magnetic field cameras or field cameras for short. Measuring apparatuses of this kind scan the magnetic field at discrete spatially distributed measuring points on a measuring surface that encloses the field of view. This measuring surface may be a spherical surface of a so-called virtual calibration sphere. The center around which the measuring surface extends coincides with the isocenter of the field of view. The measured magnetic field values, (e.g., the sensor data), may be used to calibrate a mathematical magnetic field model, (e.g., to determine magnetic field information that models the magnetic field three-dimensionally), at least within the field of view. In the case of a spherical surface as a measuring surface, but also in the case of measuring surfaces with other shapes, magnetic field decomposition may take place using harmonic functions, in particular solid harmonics, which are also referred to as solid spherical harmonics (SSH).

One known measuring apparatus, (e.g., a field camera), may be model MFC2046, available from Metrolab Technology SA, 1228 Plan-les-Quates, Geneva, Switzerland. This uses a half-disk-shaped sensor carrier with equidistant magnetic field sensors arranged on its semicircular outer edge, for example, 32 magnetic field sensors. Such magnetic field sensors may be referred to as magnetometers or also as magnetic field probes. The sensor carrier is supported by a sensor holder by which the sensor carrier may be rotated about a longitudinal axis. The magnetic field strength is measured at a predefined number, (e.g., 30), of fixed/predefined angular positions, which may be separated by 12 degrees in each case, (e.g., by the 32 magnetic field sensors). In this way, with 30 predefined measuring positions and 32 magnetic field sensors, 960 measuring points are created on a spherical surface. Using the sensor data of the magnetic field sensors, it is now possible to fit a magnetic field model to this sensor data that uses solid spherical harmonics as basic functions. In other words, coefficients of a development according to harmonic functions, in particular solid spherical harmonics, may be ascertained in order to ascertain the magnetic field information.

A main advantage of this or comparable solutions includes that the measuring apparatus may be implemented and used cost-effectively and simply, since just a few magnetic field sensors are sufficient to measure a large number of measuring points of a three-dimensional magnetic field distribution. One disadvantage is that scalar magnetic field sensors are used, meaning that only the magnitude of the magnetic field may be modeled. This makes use of the implicit assumption that the magnetic field vectors are aligned along the longitudinal direction (z-direction) within the field of view of the magnetic resonance facility. A further disadvantage results from the fact that the spatial distribution of the measuring points on the measuring surface, here the spherical surface, is highly non-uniform. Specifically, there is a high density of measuring points near the north and south poles of the spherical surface, while the sampling density decreases toward the equator.

U.S. Pat. No. 10,018,690 B2 relates to a phantom for use in a magnetic resonance facility with a set of resonating volumes on a base body with a spherical or ellipsoid shape. The phantom is positioned in the field of view after which the magnetic field may be measured by a three-dimensional spectroscopic magnetic resonance measurement. In this way, the magnetic resonance facility itself is to be used to measure the magnetic field of its main magnet.

Another approach has also proposed the use of a measuring facility with a single magnetic field sensor, (e.g., a vector magnetometer), which may be positioned at different measuring points on a measuring surface by a robot arm. This enables the costs of magnetic field sensors to be further reduced while simultaneously providing greater flexibility to produce a specific sampling pattern or three-dimensional sampling trajectory. In this context, U.S. Pat. No. 5,313,164 A discloses an apparatus for mapping a static magnetic field, wherein a magnetic field sensor, which itself operates with magnetic resonance, is successively positioned at various discrete measuring points along a helispherical or heliellipsoidal path in order to measure the static magnetic field and to position or parameterize shim facilities. Such a helispherical or heliellipsoidal sampling path should be particularly suitable for the calibration of highly homogeneous magnetic fields because homogeneous magnetic fields may be spherical or ellipsoidal. However, such approaches for measuring apparatuses have the disadvantage that an extremely long measuring time is required compared to a field camera that uses a plurality of magnetic field sensors.

U.S. Patent Application Publication No. 2022/0252685 A1 discloses a magnetic resonance facility with a field camera for determining magnetic field information in a field of view. Herein, the field camera includes a plurality of magnetic field sensors positioned at measuring positions enclosing the field of view. Herein, the magnetic field sensors are embodied as vector magnetometers and therefore measure the magnetic field three-dimensionally, i.e., in magnitude and direction. In this case, the spatial distribution of a time-varying vector magnetic field is to be calibrated.

A major problem with the aforementioned approaches in the prior art is that they are specifically developed and optimized for extremely homogeneous magnetic fields, for example, for the main magnetic field in a conventional field of view of a magnetic field resonance facility. However, in particular with newer approaches, there may be a need in magnetic resonance imaging to calibrate and model highly inhomogeneous magnetic fields, (e.g., magnetic field gradients), which are used for spatial encoding of magnetic resonance signals. In particular, as is known in the prior art, gradient fields become highly non-linear the further the distance from the isocenter and the closer the distance to the periphery of the field of view. However, this may also be said of the main magnetic field (B0 field). In particular, deviations of the magnetic fields that violate requirements also occur outside standard fields of view.

However, on the other hand, approaches have already been proposed in the prior art for extending the field of view in regions in which the requirements for standard measuring methods are no longer met. For example, U.S. Pat. No. 10,768,257 B2 proposed that first magnetic resonance data be recorded from a first recording region within a homogeneity volume of a magnetic resonance facility and second magnetic resonance data be recorded in a second recording region outside the homogeneity volume. The first and the second magnetic resonance data are reconstructed separately into image data and combined to form a combined magnetic resonance image covering an image region extending into the first recording region and the second recording region. Specifically, to account for the field inhomogeneities in the second recording region, it is proposed herein that a signal-model-based image reconstruction method be used, in particular that regridding methods be used.

SUMMARY AND DESCRIPTION

Therefore, the disclosure is based on the object of disclosing a possibility for measuring magnetic fields that allows the determination of high-quality magnetic field information, even for highly inhomogeneous magnetic fields.

This object is achieved by a method and a measuring apparatus as described herein. The scope of the present disclosure is defined solely by the appended claims and is not affected to any degree by the statements within this summary. The present embodiments may obviate one or more of the drawbacks or limitations in the related art.

According to the disclosure, it is proposed that, with a method of the type mentioned in the introduction, the measuring points are selected in a uniformly distributed sampling pattern for uniform sampling of the entire measuring surface.

In the context of the present disclosure, the measuring surface may be a spherical surface, wherein coefficients of a development according to harmonic functions, in particular according to solid harmonics (sometimes also referred to as solid spherical harmonics, SSH), are ascertained in order to ascertain the magnetic field information. However, in principle, other measuring surfaces are also conceivable, (e.g., ellipsoids or the like), for which the same model, in particular in the case of solid harmonics, or also an adapted mathematical magnetic field model may be used. Herein, the number of measuring points is expediently selected such that the fit is not determined ambiguously, thus resulting in an unambiguous solution for modeling. For example, the number of measuring points may be selected as greater than or equal to the number of coefficients to be determined in the magnetic field model. The solid harmonics should be understood as being the solutions to the Laplace equation. These are particularly suitable because the magnetic field is a harmonic field.

Furthermore, reference is made to the fact that the volume enclosed by the measuring surface does not have to completely encompass the field of view. Rather, it is also conceivable, for example, to use a measuring surface that lies within the field of view, because it has been shown, in particular when using a development according to harmonic functions, that high-quality extrapolation to the outside is also possible. However, a measuring surface spanning a larger volume allows a more precise measurement of the relevant harmonics and so the measuring surface may be selected to enclose the entire field of view as closely as possible.

If decomposition into harmonic functions, in particular solid harmonics, is used as a magnetic field model, the coefficients of the linear decomposition of the magnetic field into a weighted sum of a certain number of harmonic functions are ascertained by the fit during the calibration and modeling of the measured three-dimensional field distribution. Herein, the completeness of the magnetic field model implies that the decomposition converges to the exact result for a sufficient number of basic functions, e.g., harmonic functions.

The disadvantage of conventional approaches is that they are optimized to map a priori known field inhomogeneities so that a small number of basic functions reflecting these expected properties were used, and in particular a deliberate attempt was made to "target" certain basic functions, in particular solid harmonics and/or spherical functions. During the course of investigations, is has been established that the inhomogeneity of both the main magnetic field and the gradient fields outside the standard field of view increases dramatically, which has two consequences.

On the one hand, a significantly higher number, and significantly higher orders of harmonic functions with higher weighting occur and have to be detected and modeled. However, this means that a significantly higher number of measuring points is required. The second consequence is that the sampling patterns in the prior art, which were ascertained for highly homogeneous field distributions and/or aimed at specific field harmonics, become unsuitable. In particular, these sampling patterns in the prior art do not provide the required higher density of measuring points where this is needed.

Simulation and experimentation have now established that, in order to calibrate and model gradient fields with sufficient accuracy, for example, a high number of coefficients are required in the magnetic field model. In one example, 64 coefficients are required for each Cartesian gradient direction and for each gradient axis if the accuracy of the magnetic field model is to be less than 0.5% over a standard extent of the field of view of, for example, 50 cm in diameter (spherical). If only 16 coefficients with 16 magnetic field sensors are used, the prediction error for the magnetic field is more than 5%. If the three-dimensional gradient field is measured over an extended field of view of 70 cm in diameter (spherical), the number of coefficients increases to significantly more than 64. With only 16 coefficients/magnetic field sensors, the prediction error even rises to more than 20%. Herein, it should be noted that, in order to resolve very sensitive magnetic resonance contrasts, for example in magnetic resonance spectroscopy, the accuracy of the magnetic field model for the gradient fields should be in the ppm range.

In summary, accurate calibration and modeling of such inhomogeneous magnetic fields requires a higher number of model coefficients, e.g., also in particular a higher degree and a higher order of harmonic functions in order to model the magnetic field, resulting in a higher number of measuring points and possibly a higher number of magnetic field sensors.

However, this is compounded by the problem that the sampling patterns used to date are unsuitable in this respect. Using the example of solid harmonics, these may be numbered with the indices 1 (degree) and m (order), wherein different degrees and orders result in different field patterns on the measuring surface, in this case the spherical surface. For example, for an order of zero, so-called zonal harmonics may occur, and these are characterized by an alternation of maxima and minima along the longitudinal direction on the spherical surface. Sectoral harmonics, which may occur for m=+/−1, are characterized by alternating maxima and minima along the latitudinal direction in the field distribution on the spherical surface. Combinations of zonal and sectoral distributions are called tesseral patterns in which alternating minima and maxima may occur in both directions (longitudinal direction and latitudinal direction of the spherical surface).

Based on these investigations and conclusions, the present disclosure proposes the use of a uniformly distributed sampling pattern by selecting a bidirectionally uniform distribution of measuring points on the measuring surface. This enables any patterns, in particular also tesseral patterns, to be measured with sufficient accuracy.

Overall, therefore, a uniform distribution of the measuring points on the measuring surface allows a sufficiently accurate measurement of any inhomogeneous field distributions since all types of harmonics that occur may be detected with the same accuracy and thus also modeled. This not only enables edge regions of nominal fields of view to be measured and modeled in an improved manner, in particular also with respect to gradient fields, it also enables mapping of magnetic fields outside the nominal field of view of a magnetic resonance facility, for example, for methods such as those described in U.S. Pat. No. 10,768,257 B2.

The field of view may be selected as larger than a nominal field of view of the magnetic resonance facility and/or with a diameter larger than 40 cm, in particular in the range of 50 to 70 cm. Nominal fields of view of magnetic resonance facilities, which may be spherical, for example, relate to the region in which set requirements for homogeneity are met. Especially for approaches in which an extended field of view is to be used, it is possible to go beyond this nominal field of view. The corresponding extended field of view may only be calibrated and/or modeled very inaccurately with conventional methods, because these methods are not designed for the inhomogeneities that occur there. However, the uniform distribution of the measuring points over the measuring surface, in particular the spherical surface, enables a sufficiently accurate measurement with reasonable effort.

Here, furthermore, the measuring surface may correspond to the surface of the field of view and/or completely enclose the field of view. Especially in the case of spherical fields of view, it is particularly expedient to use the surface of the field of view as a measuring surface, which is then a spherical surface. In other cases, it is most expedient for the field of view to be enclosed as closely as possible. However, as explained above, it is also conceivable for the measuring surface to be defined within the field of view.

The at least one magnetic field sensor may measure the magnitude of the magnetic field and/or a direction of the magnetic field at the respective measuring points. Herein, it is particularly advantageous, in particular in the case of applications at the edge of a nominal field of view or for a field of view that is extended compared to the nominal field of view, also to measure the direction of the magnetic field to allow modeling in this respect as well. In particular in the case of inhomogeneities, it may not be assumed that the magnetic field is oriented in the nominal direction of the main magnetic field. This nominal direction may be the longitudinal direction of a cylindrical patient receptacle of the magnetic resonance facility, which is also referred to as the z-direction of the magnetic resonance facility.

The at least one magnetic field sensor used may be a measuring arrangement includes a measuring phantom, e.g., including a MR-active substance, and a measuring coil or a Hall sensor. Such measuring arrangements, also known as field probes, are frequently called magnetic field probes. They may measure scalar quantities, e.g., the magnitude of the magnetic field. On the other hand, Hall sensors may be implemented as vector magnetometers and may also measure the direction of the magnetic field. Nowadays, Hall sensors may be provided in a very small and cost-effective form on a semiconductor basis, in particular as a chip.

As already mentioned, the magnetic field may include a main magnetic field of a main magnet of the magnetic resonance facility and/or at least a gradient field of a gradient coil arrangement of the magnetic resonance facility.

Expediently, the measuring points on the measuring surface embodied as a spherical surface may be determined as a Fibonacci lattice using a Fibonacci sphere algorithm. While the prior art has already proposed various possibilities for distributing measuring points on the surface of a sphere, mapping the Fibonacci lattice onto the surface of the sphere is an extremely fast and effective ascertaining method for achieving this goal. In this respect, variants/improvements have already been proposed in order to further optimize and compare the distance between the measuring points ascertained in this way. A pseudocode of a known Fibonacci algorithm may be expressed as follows for N measuring points:

```
phi = (3-sqrt(5))* pi;
X = zeros(1,N); Y=X; Z=X;
for i=1 to N−1
y = 1 − 2*i/(N−1);
yradius = sqrt(1−y^2);
theta = phi * i;
X(i) = yradius * cos(theta);
Y(i) = y;
Z(i) = yradius * sin(theta);
end
```

In a specific embodiment, the measuring apparatus may include a movable carrier component with the at least one magnetic field sensor, wherein the carrier component is moved successively to different measuring positions by a moving facility of the measuring apparatus in order to completely measure the measuring surface. In this case, the measuring apparatus may also include a control facility that may actuate the moving facility and the at least one magnetic field sensor accordingly in order to approach desired measuring points and take measurements.

Herein, a solution with particularly few magnetic field sensors may provide that the carrier component includes exactly one magnetic field sensor and/or that the moving facility is a robot arm. The control facility may now actuate the robot arm such that the one magnetic field sensor is successively placed at all measuring points that are predetermined accordingly. Sensor data is captured for each measuring point, in particular the local field strength of the magnetic field and/or the three Cartesian components of the vector magnetic field. Such an embodiment provides maximum flexibility with respect to the number of measuring points, the sampling trajectory, and the like. In particular, it is possible to vary the sampling density and/or to use different measuring surfaces, for example spheres with different diameters, ellipsoids, and the like. However, the long measurement time, e.g., calibration time, may prove to be problematic with such an exemplary embodiment.

In an embodiment of the present disclosure, the carrier component may have a carrier surface covering part of the measuring surface on which the plurality of magnetic field sensors are arranged in a uniformly distributed manner according to the uniformly distributed measuring points, wherein the carrier surface covers different portions of the measuring surface for the different measuring positions such that each measuring point is measured at least once. In order to reduce the measuring time, in particular compared to the use of only one single magnetic field sensor, a plurality of magnetic field sensors may be used that form a type of "carrier array," which, at least in the position of the magnetic field sensors, emulates part of the measuring surface and the measuring points there. This sensor array is arranged at different measuring positions such that ultimately all measuring points may be covered with a reduced number of measuring acts. For this purpose, the magnetic field sensors are arranged uniformly distributed according to the sampling pattern on the carrier surface, which is shaped as a section of the measuring surface. Therefore, at the different measuring positions, the carrier surface forms a different proportion of the entire measuring surface, which over time is then completely covered after the plurality of measuring acts and also maintains the uniform distribution of the measuring points, since the arrangement of the magnetic field sensors is selected according to this uniform distribution on the carrier surface.

For example, in the case of a spherical surface as the measuring surface, the carrier component may be embodied as a spherical dome, which may be understood as a cut-out portion of a virtual measuring sphere and on which the magnetic field sensors are arranged in a uniformly distributed manner according to the sampling pattern, which may then, for example, be determined using the Fibonacci sphere algorithm. Because the distribution of the measuring points is uniform over the entire spherical surface as the measuring surface, the measuring surface may be positioned (rotated, tilted, and/or shifted) by the moving facility such that the positions of the magnetic field sensors on the carrier component match measuring points. Once the distribution of the measuring points of the control facility is known, these actuators may actuate the moving facility accordingly in order to approach the entirety of the measuring points in as few calibration acts as possible and measure them accordingly.

A particularly advantageous embodiment results if the shape of the carrier surface is selected such that a natural number of the carrier surfaces are combined to form the complete measuring surface, in particular the spherical surface, wherein the number of measuring positions corresponds to the natural number. In the case of an ultimately arbitrary segment of the measuring surface as the carrier surface, there may be an overlap between the covered parts of the measuring surface at different measuring positions. Herein, although it is conceivable in this context for the measuring accuracy to be increased for measuring points that are measured twice by averaging the corresponding sensor data, the measuring time may be minimized if such an overlap is minimized or even completely prevented.

According to the disclosure, utilization may now be made of the fact that it is known from analytical geometry in the prior art to decompose the surface of a sphere into similar curved carrier surfaces, known as polyhedral surfaces. In other words, therefore, this embodiment proposes that, with a spherical surface as the measuring surface, the carrier surface is embodied as a polyhedral surface. The process for obtaining polyhedral surfaces is also referred to as sphere decomposition (sphere tessellation), wherein, purely by way of example, reference is made to the article "Dividing a sphere into equal-area and/or equilateral spherical polygons" by Anooshe Rezaee Javan et al., Journal of Computational Design and Engineering, 9 (2022), pp. 826-836. It should be noted that the uniform distribution of the measuring points over the measuring surface of a calibration sphere generates such a decomposition after this forms a tetrahedral shape in the group of four adjacent measuring points, for example, wherein these tetrahedral shapes form the entire spherical surface as a curved mosaic. When such a carrier surface is selected, it is sufficient to use exactly as many measuring positions as carrier surfaces are necessary to form the entire measuring surface without gaps.

The carrier surface does not necessarily have to be curved—it may also be selected as flat. For example, it is conceivable to approximate a spherical surface using a polyhedron or to select a directly polyhedral measuring surface. Platonic bodies or approximately platonic bodies composed of congruent peripheral surfaces are particularly suitable here. If, for example, such a peripheral surface is selected as a carrier surface, it may be automatically composed from a natural number of the carrier surfaces. For example, a measuring surface may be formed as the surface of a dodecahedron or an icosahedron. Other approximations or constructions with flat carrier surfaces are also conceivable.

Specific embodiments of the moving facility are described in more detail below with respect to the measuring apparatus. Herein, it should be noted at this point that all explanations of the method may be transferred analogously to the measuring apparatus and vice versa. In this way, the measuring apparatus may also achieve the advantages resulting from the method and vice versa.

A measuring apparatus for measuring a magnetic field in a field of view of a magnetic resonance facility has a movable carrier component with at least one magnetic field sensor, a moving facility for moving the carrier component, and a control facility, wherein the control facility is configured to measure sensor data describing the magnetic field by uniformly sampling the entire measuring surface at a plurality of measuring points in a uniformly distributed sampling pattern on a measuring surface enclosing at least part of the field of view by actuating the moving facility and the at least one magnetic field sensor. The control facility may furthermore also be configured to ascertain magnetic field information, which models the magnetic field three-dimensionally, at least within the field of view, from the sensor data.

Herein, for both the method and the measuring apparatus, the magnetic field information obtained may be further used for various purposes. For example, the magnetic field information may be used to select and/or parameterize corrective measures and/or stored as calibration information to be used for magnetic resonance sequences and/or recording protocols in the reconstruction of magnetic resonance images and/or other imaging results.

As already discussed, it is possible on the one hand that the carrier component only includes one single magnetic field sensor and the moving facility is a robot arm. This allows a high degree of flexibility but may result in a long overall measuring time if there is a large number of measuring points. In contrast, as described, the carrier component may have a carrier surface covering part of the measuring surface on which the plurality of magnetic field sensors are arranged in a uniformly distributed manner according to the uniformly distributed measuring points. Here, the carrier surface may cover different portions of the measuring surface for different measuring positions such that each measuring point is measured at least once. Herein, it may particularly advantageously be provided that the shape of the carrier surface is selected such that a natural number of the carrier surfaces are combined to form the complete measuring surface, in particular the spherical surface. The number of measuring positions may then correspond to the natural number.

It is particularly expedient with respect to the measuring apparatus for the measuring surface to be a spherical surface if the moving facility has at least two rotation actuators for rotation about mutually perpendicular axes of rotation for positioning the carrier surface on the measuring surface as desired. For example, a first rotation actuator may refer to a horizontal axis of rotation. The second rotation actuator is rotated by the first rotation actuator and relates to the remaining degree of freedom on the spherical surface. For example, the measuring apparatus may then be positioned to measure the magnetic field such that the intersection of the first axis of rotation and the second axis of rotation is in the isocenter of the field of view. In this case, only two degrees of rotational freedom are required to position the carrier surface at the measuring position on the spherical surface. These are provided by the two rotation actuators.

In order to provide that the magnetic field sensors are also located on the corresponding measuring points, it may additionally be necessary to rotate the carrier surface itself, for example, about its center point. In this context, the occupancy facility may have a further actuator for rotating the carrier surface with the plurality of magnetic field sensors about itself, in particular about an axis of rotation running through the center point of the surface of revolution. This axis of rotation may also run through the isocenter of the field of view.

In a first advantageous specific embodiment, it may be provided that the moving facility has a circular arc arm that may be rotated about a horizontal axis of rotation by the first rotation actuator to which the carrier component is coupled via a guide block that may be displaced by the second rotation actuator. The circular arc arm, which may be rotated via the first rotation actuator, thus simultaneously forms the guide for a guide block in its circular arc portion on which the carrier component is arranged, so that the carrier surface may be rotated about the second axis of rotation by displacing the guide block on the circular arc arm by the second rotation actuator. For example, the guide block may wrap round the circular arc arm and/or engage in the circular arc arm, where the second rotation actuator, (e.g., a motor), may be arranged. The circular arc arm may extend over an angular range of at least 180°, thereby enabling, for example, an adjustment of +/−90°. The circular arc arm may also be extended, for example, up to a complete circle. In such a case, the guide block may enable a rotation of 360° about the point of intersection of the first or second axis of rotation.

In a further alternative specific embodiment, the moving facility may have a frame arm that may be rotated about a horizontal axis of rotation by the first rotation actuator to which the carrier component is coupled at an end facing away from the first rotation actuator along the horizontal axis of rotation via the second rotation actuator, wherein the frame arm defines a free space along the first horizontal axis of rotation corresponding at least to the diameter of the measuring surface for rotating the carrier component by the second rotation actuator.

Compared to the first exemplary embodiment described above, the advantage here is that, in this second specific embodiment, the length of the cables for the second rotation actuator and/or the further actuator and/or the magnetic field sensors is the same length for all spatial positions of the carrier component. Here, the frame arm provides the rotational clearance for the carrier component by the second rotation actuator through a correspondingly framed gap. Therefore, there is no need for extensible cables or cable reels that work with variable cable lengths. Although, in principle, the frame arm only has to define a half frame, it may be expedient for this to be embodied as completely circumferential, e.g., as a complete frame, in order to increase mechanical stability during the measuring process.

Overall, the measuring apparatus may be used at different locations. While it is in principle conceivable to measure the magnetic field at the installation site of the magnetic resonance facility when the magnetic resonance facility is already complete or at least fully installed with respect to the magnetic field components, the measuring apparatus may also be used during production. For example, the measuring apparatus may be used to calibrate the main magnetic field in the production line before further components are installed. It is also conceivable to use the measuring apparatus solely to calibrate at least one gradient coil of a gradient coil arrangement before it is installed.

Herein, it should also be noted at this point that the number of measuring points may in particular correspond to at least the number of coefficients to be determined. Depending upon the expected degree of inhomogeneity, a large number of many measuring points may be necessary, for example, at least 300, at least 600, or at least 900 measuring points.

BRIEF DESCRIPTION OF THE DRAWINGS

Further advantages and details of the present disclosure emerge from the embodiments described in the following and with reference to the drawings.

DETAILED DESCRIPTION

Figure 1:
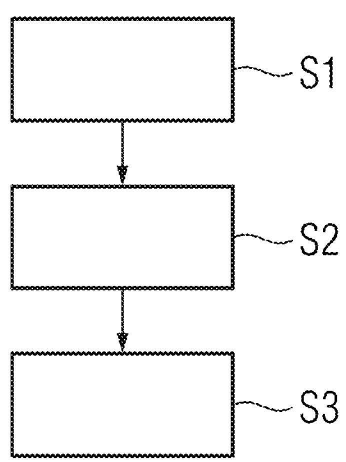
FIG. 1 depicts a flow chart of an embodiment of the method.

FIG. 1 shows a flow chart of an embodiment of the method. Herein, in the present case, the magnetic field is to be measured within the field of view of a magnetic resonance facility for which purpose, first, act S1 is the placing of a measuring apparatus suitable for capturing sensor data of the magnetic field.

Figure 2:
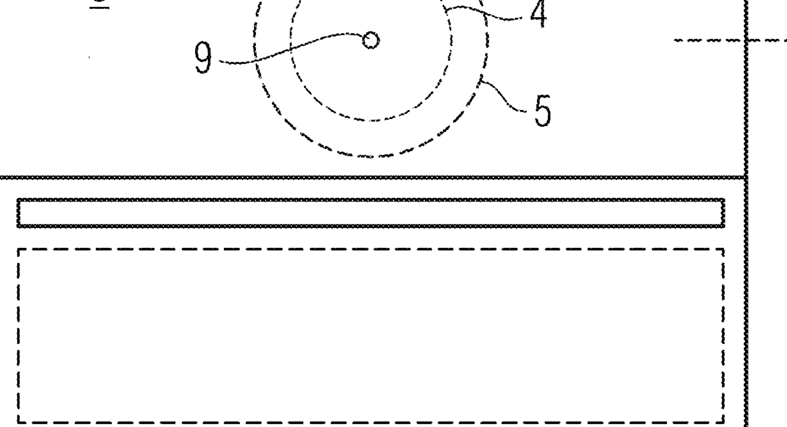
FIG. 2 is a schematic sketch of an example of a field of view and an extended field of view in a magnetic resonance facility.

Herein, FIG. 2 schematically shows the patient receptacle 3 defined by a main magnet unit 1 of the magnetic resonance facility 2 and possible definitions of fields of view 4, 5 therein. The main magnet unit 1 includes a superconducting main magnet 6, which generates a main magnetic field (B0 field) that runs in the longitudinal direction 7 (z-direction) of the cylindrical patient receptacle and meets requirements for homogeneity in a homogeneity volume in the center of the patient receptacle 3. The figure furthermore shows a gradient coil arrangement 8 for generating gradient fields, in particular for spatial encoding.

The field of view 4 is the nominal field of view of the magnetic resonance facility 2. In the present case, this is embodied as spherical and has been defined such that it meets requirements for the homogeneity of the main magnetic field as well as requirements for the gradient fields, for example in terms of their linearity. Nevertheless, inhomogeneities/major deviations from the linearity of the gradient fields may still occur within the nominal field of view 4 at its edge, e.g., away from the isocenter 9.

For example, in the case of larger or more obese patients and/or in the case of recording regions at the far edges of patients' bodies, it may be desirable to use a field of view 5 that is wider than the nominal field of view 4. This field of view no longer meets the requirements for the main magnetic field and the gradient fields, but suitable reconstruction methods may take account of deviations from homogeneity in the reconstruction. This may be an application of the magnetic field information ascertained with the method. If, for example, the nominal field of view 4 has a diameter of 50 cm, the extended field of view 5 may have a diameter of 70 cm.

In principle, the magnetic field to be measured may include the main magnetic field and/or the gradient field. It should be noted that solely the gradient field may be measured, for example in the production line before the gradient coil arrangement 8 is installed in the main magnet unit 1. In the present example, the aim is to measure both the main magnetic field and the gradient fields in the extended field of view 5, possibly in a plurality of successive measuring processes.

The aim of the measurement is to parameterize a magnetic field model of the magnetic field information. In the present case, the magnetic field is modeled in a decomposition according to harmonic functions, in particular according to solid harmonics, e.g., represented as the sum of different harmonic functions as basic functions, wherein the respective coefficients indicate the weighting in the sum. Therefore, in the present case, the magnetic field is to be measured by the measuring apparatus at measuring points that are located on a measuring surface embodied as a spherical surface of a virtual measuring sphere or calibration sphere. Herein, in the present case, the measuring surface may be selected as the surface of the respective spherical field of view 4, 5 in the example of the extended field of view 5.

Returning to FIG. 1, act S2 is therefore the recording of sensor data with the at least one magnetic field sensor of the measuring apparatus at measuring points on the measuring surface. Because measurements are taken in the extended field of view 5, strong inhomogeneities are to be expected so that a large number of harmonic functions, here solid harmonics, have to be taken into account as basic functions and a correspondingly large number of coefficients are determined in the following act S3 when evaluating the sensor data. This not only requires a high number of measuring points on the measuring surface, but also a clever selection of measuring points, since both zonal and sectoral and tesseral patterns may occur on the measuring surface.

Figure 3:
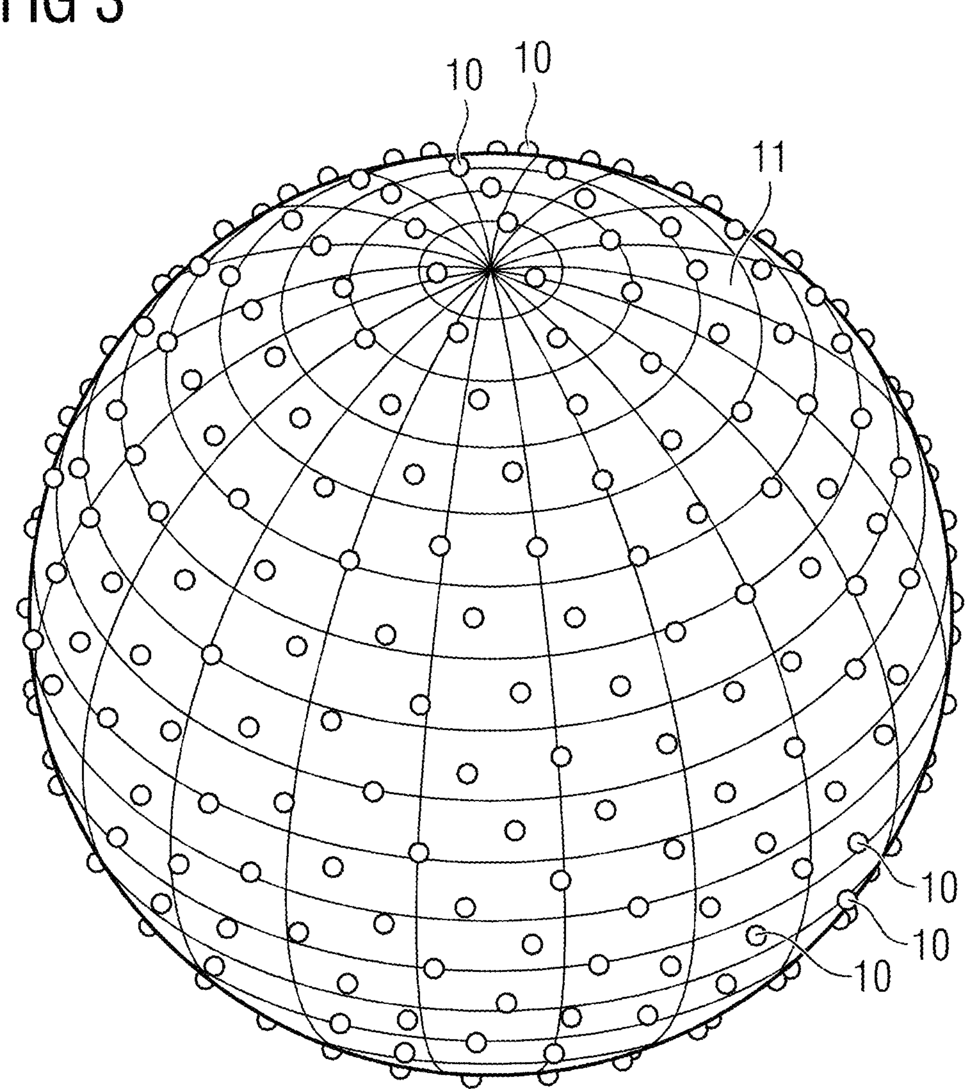
FIG. 3 depicts an example of a distribution of measuring points on a measuring surface.

In the method, the measuring points are selected such that a uniform distribution, e.g., a uniform sampling pattern, is obtained for the entire measuring surface. This is shown by way of example for 360 measuring points 10 on a measuring surface 11 embodied as a spherical surface in FIG. 3. The measuring points shown there were determined with the Fibonacci sphere algorithm, e.g., as a Fibonacci lattice, on the measuring surface 11.

The measuring apparatus is embodied to perform the measurements successively over a plurality of measuring positions of a carrier component carrying the at least one magnetic field sensor, e.g., in different calibration acts. While in one flexible embodiment of a measuring apparatus, it is conceivable to arrange one single magnetic field sensor on a robot arm as a moving facility, according to the disclosure, a plurality of magnetic field sensors may be provided on a carrier surface of the carrier component in order to reduce the overall measuring time so that several measuring points 10 may be measured simultaneously at one measuring position.

Corresponding embodiments of such measuring apparatuses is explained in more detail later on with regard to FIGS. 4 to 7.

In any case, the course of the carrier surface on which the magnetic field sensors are arranged corresponds to part of the measuring surface 11, wherein the magnetic field sensors are arranged on the carrier surface according to the measuring points 10, e.g., the uniform sampling pattern. Therefore, the carrier surface may be understood to be a segment of the measuring surface 11 in FIG. 3, wherein magnetic field sensors are arranged on the measuring points 10 of the segment. Herein, the carrier surface may be determined by spherical tessellation such that a natural number of carrier surfaces are added to the entire measuring surface 11 without overlaps or gaps, so that all measuring points 10 may be measured with this natural number of measuring positions. If overlaps occur in other cases, sensor data from multiple measuring points 10 may be averaged to increase accuracy. In other exemplary embodiments, a spherical surface may also only be approximated or a polyhedral measuring surface may be selected if the carrier surface is selected to be flat.

In act S3, the coefficients of the respective harmonic functions, here solid harmonics, are determined in the fit by evaluating the sensor data. Because, due to the clever choice of measuring points 10, the sampling in act S2 has taken place bidirectionally uniformly on the measuring surface 11, the desired sampling density is obtained in all directions and the magnetic field may be modeled with high accuracy despite inhomogeneities. The magnetic field information may be stored for the selection and/or parameterization of compensation measures, (e.g., shim measures), and/or as calibration information for the reconstruction in particular outside the nominal field of view 4.

Figure 4:
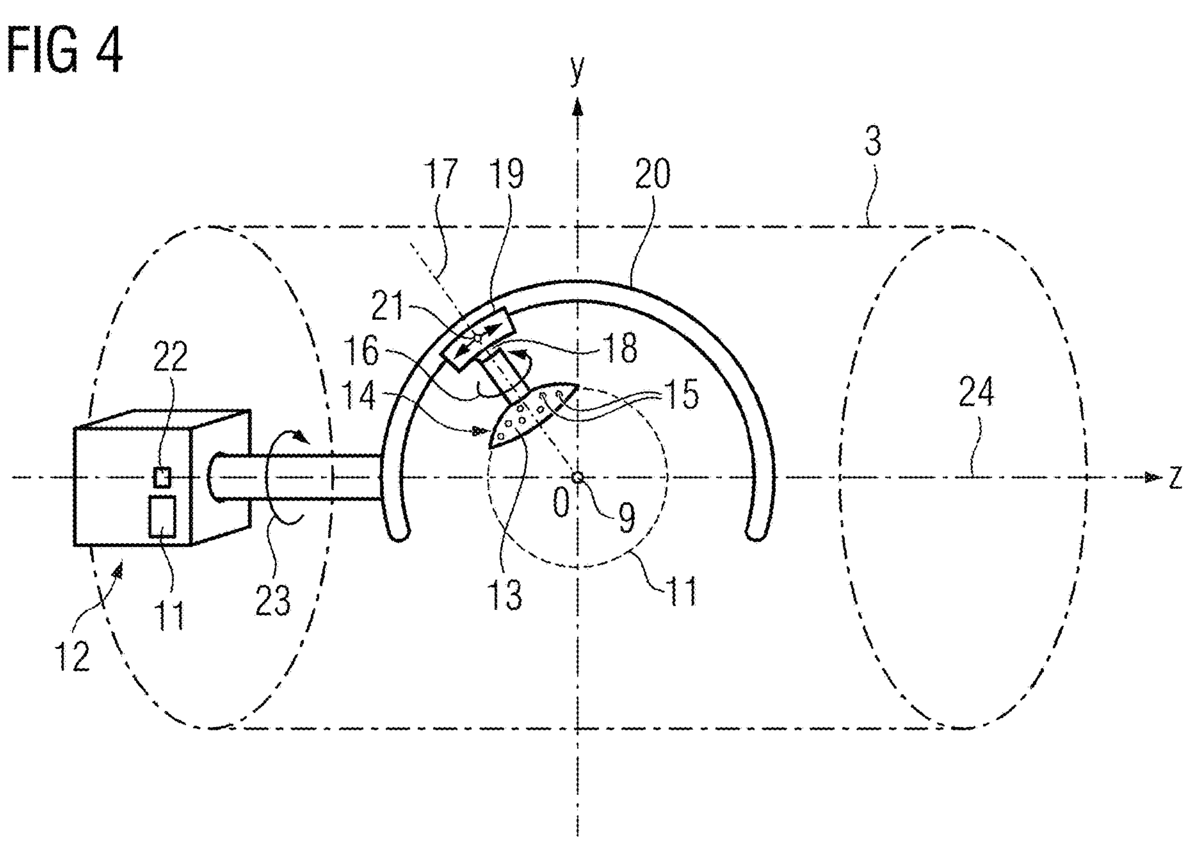
FIG. 4 is a schematic sketch of a measuring apparatus according to an embodiment.

FIG. 4 shows a first exemplary embodiment of a measuring apparatus 12, which has already been positioned according to act S1 such that a measurement may take place on the measuring surface 11 which extends around the isocenter 9 of the patient receptacle 3. The measuring apparatus 12 has a plurality of magnetic field sensors 15 arranged uniformly distributed on a carrier surface 13 of a carrier component 14. The carrier component 14 may be rotated according to the arrow 16 about an axis of rotation 17 extending through the center point of the carrier surface 13 and the isocenter 9. For this purpose, an actuator 18 is used which couples the carrier component 14 to a guide block 19 which is guided on a circular arc arm 20. A rotation actuator 21 may be used to move the guide block 19 along the circular arc arm 20 and thus enables the carrier component 14, and therefore the carrier surface 13, to rotate about an axis of rotation, which in the position shown, is perpendicular to the drawing plane and extends through the isocenter 9. The circular arc arm 20 may in turn be rotated by a rotation actuator 22 according to the arrow 23 about a horizontal axis of rotation 24 that also extends through the isocenter 9. Although, in this example, the circular arc arm 20 is shown as only covering part of 360°, it may be extended accordingly if necessary.

The rotation actuators 22, 21 may be used to move the carrier surface 13 to any required measuring positions on the measuring surface 11. If necessary, the further actuator 18 may be used to adapt the orientation of the carrier surface 13 such that the magnetic field sensors 15 are also actually positioned on the desired measuring points 10, as predetermined and selected. Depending on the sampling density, here rotatability according to the arrow 16 by 180°, 90°, or even only 10° may be sufficient.

The measuring apparatus 12 furthermore has a control facility 25 that controls the measuring operation, e.g., by actuating the actuators 22, 21, 18 for setting measuring positions and the magnetic field sensors 15 for performing the measurements.

Figure 5:
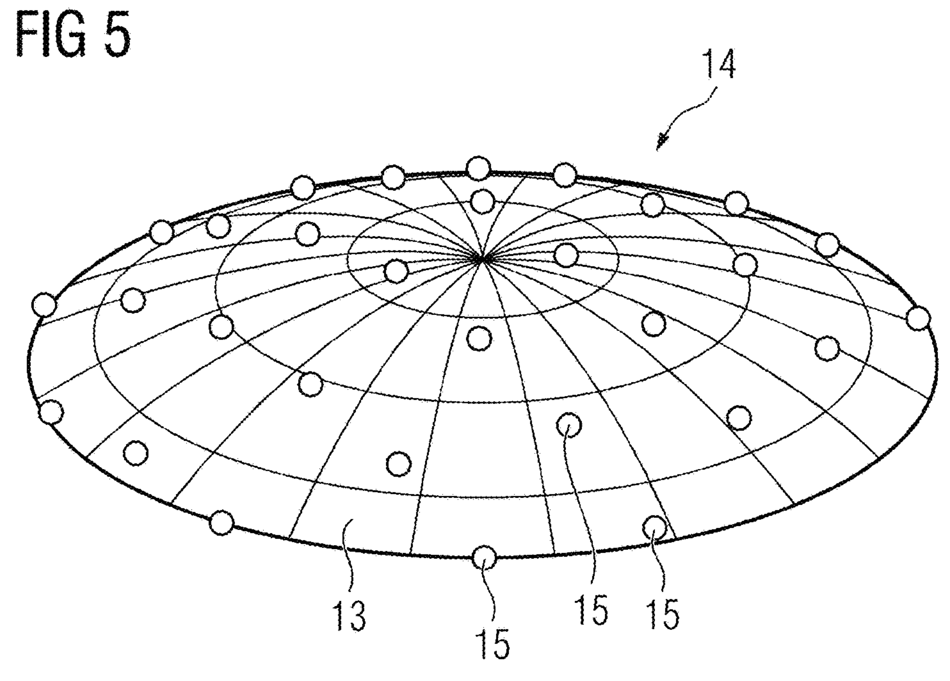
FIG. 5 is a schematic sketch of an example of a carrier component of the measuring apparatus.

FIG. 5 shows a possible embodiment of the carrier component 14 as a spherical dome whose carrier surface 13 has a curvature corresponding to the measuring surface 11, wherein the magnetic field sensors 15 are located at the corresponding measuring points 10 of the segment.

Figure 6:
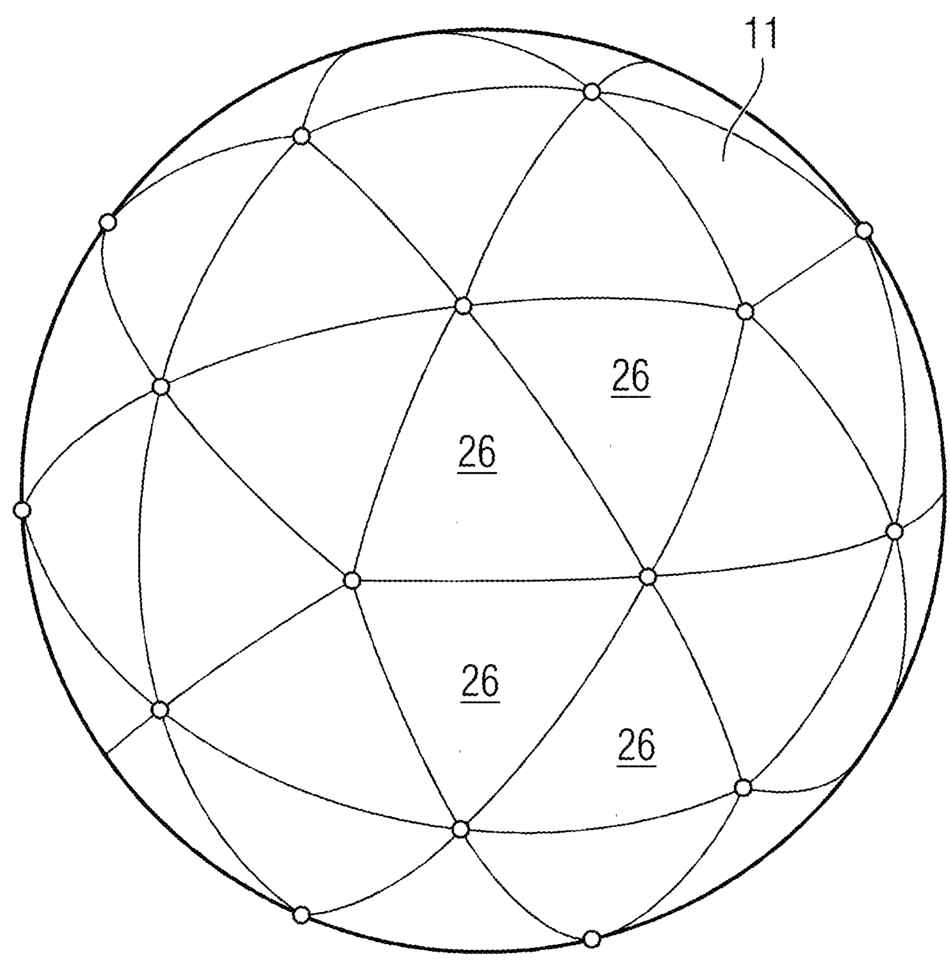
FIG. 6 depicts an example of the decomposition of a sphere into polyhedral surfaces.

FIG. 6 shows by way of example a spherical tessellation for a measuring surface 11 which is decomposed into equal segments 26, specifically polyhedral surfaces. If such a polyhedral surface is selected for the carrier surface 13, all measuring points 10 may be approached and measured at corresponding measuring positions in a time-efficient manner without any overlaps.

Figure 7:
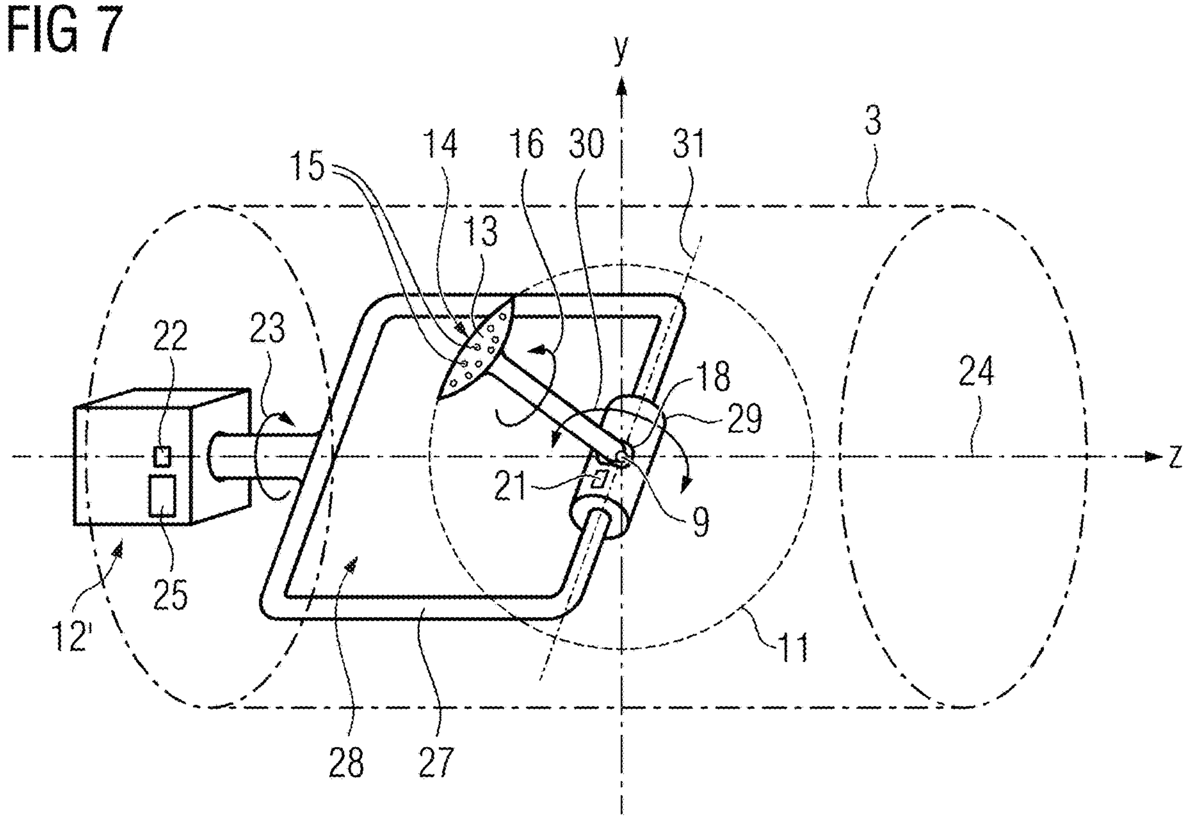
FIG. 7 is a schematic sketch of a measuring apparatus according to an embodiment.

FIG. 7 shows a second exemplary embodiment of a measuring apparatus 12', wherein, for the sake of simplicity, corresponding components are provided with the same reference symbols. Herein, the carrier component 14 with the carrier surface 13 and the magnetic field sensors 15 and the actuator 18 correspond to the explanations for the first exemplary embodiment. This also applies to the rotation actuator 22. However, this now rotates a frame arm 27 about the horizontal axis of rotation 24 which defines a free space 28. The carrier component 14 may be rotated through this space by the rotation actuator 21, which is only indicated here. This is because the carrier component is articulated on the side facing away from the rotation actuator 22 via a rotary joint 29. The rotation actuator 21 achieves a rotation according to the arrow 30 about the axis of rotation, which also runs through the isocenter.

The fact that the frame arm 27 forms a complete frame achieves high mechanical stability.

Independent of the grammatical term usage, individuals with male, female, or other gender identities are included within the term.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for measuring a magnetic field in a field of view of a magnetic resonance facility, the method comprising:

providing a measuring apparatus comprising at least one magnetic field sensor;

measuring sensor data describing the magnetic field at measuring points on a measuring surface enclosing at least part of the field of view, wherein the measuring surface is a spherical surface; and ascertaining magnetic field information that models the magnetic field three-dimensionally, at least within the field of view, from the sensor data, wherein the measuring points are selected in a uniformly distributed sampling pattern for uniform sampling of an entirety of the measuring surface, and wherein the measuring points on the measuring surface are determined as a Fibonacci lattice using a Fibonacci sphere algorithm.

2. The method of claim 1, wherein coefficients of a development according to harmonic functions are determined to ascertain the magnetic field information.

3. The method of claim 2, wherein the harmonic functions are solid harmonics.

4. The method of claim 1, wherein the field of view is selected as larger than a nominal field of view of the magnetic resonance facility and/or with a diameter that is at least 40 cm.

5. The method of claim 4, wherein the diameter is in a range of 50 cm to 70 cm.

6. The method of claim 1, wherein the magnetic field comprises a main magnetic field of a main magnet of the magnetic resonance facility, at least one gradient field of a gradient coil arrangement of the magnetic resonance facility, or a combination thereof.

7. The method of claim 1, wherein the measuring apparatus comprises a carrier component with the at least one magnetic field sensor, and wherein the carrier component is moved successively to different measuring positions by a moving facility of the measuring apparatus to completely measure the measuring surface.

8. The method of claim 7, wherein the at least one magnetic field sensor comprises a plurality of magnetic field sensors, wherein the carrier component has a carrier surface covering part of the measuring surface on which the plurality of magnetic field sensors is arranged in a uniformly distributed manner according to the uniformly distributed sampling pattern of the measuring points, and wherein the carrier surface covers different portions of the measuring surface for the different measuring positions such that each measuring point is measured at least once.

9. The method of claim 8, wherein a shape of the carrier surface is selected such that a natural number of carrier surfaces are combined to form the entirety of the measuring surface, and wherein a number of measuring positions corresponds to the natural number.

10. A measuring apparatus for measuring a magnetic field in a field of view of a magnetic resonance facility, the measuring apparatus comprising:

a carrier component having at least one magnetic field sensor;

a moving facility configured to move the carrier component; and a control facility configured to measure sensor data describing the magnetic field by uniformly sampling a measuring surface enclosing at least part of the field of view at a plurality of measuring points in a uniformly distributed sampling pattern on an entirety of the measuring surface by actuating the moving facility and the at least one magnetic field sensor, wherein the measuring surface is a spherical surface, and wherein the measuring points on the measuring surface are determined as a Fibonacci lattice using a Fibonacci sphere algorithm.

11. The measuring apparatus of claim 10, wherein the at least one magnetic field sensor comprises a plurality of magnetic field sensors, and wherein the carrier component has a carrier surface covering at least part of the measuring surface on which the plurality of magnetic field sensors are arranged in a uniformly distributed manner according to the uniformly distributed measuring points.

12. The measuring apparatus of claim 11, wherein a shape of the carrier surface is selected such that a natural number of carrier surfaces are combined to form the entirety of the measuring surface.

13. The measuring apparatus of claim 11, wherein the moving facility has at least two rotation actuators for rotation about mutually perpendicular axes of rotation for positioning the carrier surface on the measuring surface.

14. The measuring apparatus of claim 13, wherein the moving facility has a further actuator configured to rotate the carrier surface with the plurality of magnetic field sensors about the carrier surface.

15. The measuring apparatus of claim 14, wherein an axis of rotation of the carrier surface runs through a center point of a surface of revolution.

16. A measuring apparatus for measuring a magnetic field in a field of view of a magnetic resonance facility, the measuring apparatus comprising:

a carrier component having at least one magnetic field sensor;

a moving facility configured to move the carrier component; and a control facility configured to measure sensor data describing the magnetic field by uniformly sampling a measuring surface enclosing at least part of the field of view at a plurality of measuring points in a uniformly distributed sampling pattern on an entirety of the measuring surface by actuating the moving facility and the at least one magnetic field sensor, wherein the carrier component has a carrier surface covering at least part of the measuring surface, wherein the moving facility has at least two rotation actuators for rotation about mutually perpendicular axes of rotation for positioning the carrier surface on the measuring surface, and wherein the moving facility has a circular arc arm configured to rotate about a horizontal axis of rotation by a first rotation actuator of the at least two rotation actuators to which the carrier component is coupled via a guide block configured to be displaced by a second rotation actuator of the at least two rotation actuators, or wherein the moving facility has a frame arm configured to rotate about the horizontal axis of rotation by the first rotation actuator of the at least two rotation actuators to which the carrier component is coupled at an end facing away from the first rotation actuator along the horizontal axis of rotation via the second rotation actuator of the at least two rotation actuators, and the frame arm defines a free space along the horizontal axis of rotation corresponding at least to a diameter of the measuring surface for rotating the carrier component by the second rotation actuator.

17. The measuring apparatus of claim 16, wherein the moving facility has the frame arm.

18. The measuring apparatus of claim 16, wherein the moving facility has the circular arc arm.

* * * * *